(12) United States Patent
Doolittle

(10) Patent No.: US 6,351,682 B1
(45) Date of Patent: Feb. 26, 2002

(54) SEMICONDUCTOR PROCESSING WORKPIECE POSITION SENSING

(75) Inventor: James W. Doolittle, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/388,004

(22) Filed: Sep. 1, 1999

Related U.S. Application Data

(62) Division of application No. 08/940,523, filed on Sep. 30, 1997, now Pat. No. 6,015,462.

(51) Int. Cl.[7] .......................... G06F 19/00; G06F 15/00
(52) U.S. Cl. ......................... 700/121; 702/150; 438/17; 205/82; 216/90
(58) Field of Search .......................... 700/66, 121, 150, 700/192; 702/55, 116, 150; 438/10, 17; 118/28; 216/90, 91; 205/81, 82, 123

(56) References Cited

U.S. PATENT DOCUMENTS

| 3,302,753 A | | 2/1967 | Rosenberg | 187/414 |
|---|---|---|---|---|
| 3,607,549 A | | 9/1971 | Bielefeld, Jr. et al. | 156/345 |
| 4,662,975 A | | 5/1987 | Dufresne et al. | 156/345 |
| 4,906,341 A | * | 3/1990 | Yamakawa et al. | 205/123 |
| 4,995,939 A | | 2/1991 | Ferenczi et al. | 205/791 |
| 5,168,886 A | | 12/1992 | Thompson et al. | 134/153 |
| 5,248,380 A | | 9/1993 | Tanaka | 216/59 |
| 5,332,445 A | * | 7/1994 | Bergman | 134/3 |
| 5,571,325 A | | 11/1996 | Ueyama et al. | 118/320 |
| 5,573,624 A | | 11/1996 | Barbee et al. | 156/345 |
| 5,578,167 A | | 11/1996 | Sooriakumar et al. | 438/745 |
| 5,747,689 A | * | 5/1998 | Hampo et al. | 73/304 C |
| 5,882,425 A | | 3/1999 | Graham | 134/1.3 |
| 5,985,126 A | * | 11/1999 | Bleck et al. | 205/123 |
| 6,015,462 A | * | 1/2000 | Doolittle | 118/668 |
| 6,090,711 A | * | 7/2000 | Batz, Jr. et al. | 438/689 |

* cited by examiner

Primary Examiner—William Grant
Assistant Examiner—Paul L. Rodriguez
(74) Attorney, Agent, or Firm—Polit & Associates, LLC

(57) ABSTRACT

The present invention provides semiconductor workpiece position sensors and methods of monitoring the position of a semiconductor workpiece. One embodiment of the invention provides a method of monitoring position of a semiconductor workpiece including providing a process module including a process container having a process fluid therein and a workpiece holder configured to support the semiconductor workpiece, moving the semiconductor workpiece toward the process fluid within the process container, applying a reference signal to the process module, and indicating position of the semiconductor workpiece with respect to the process fluid responsive to the reference signal.

20 Claims, 6 Drawing Sheets

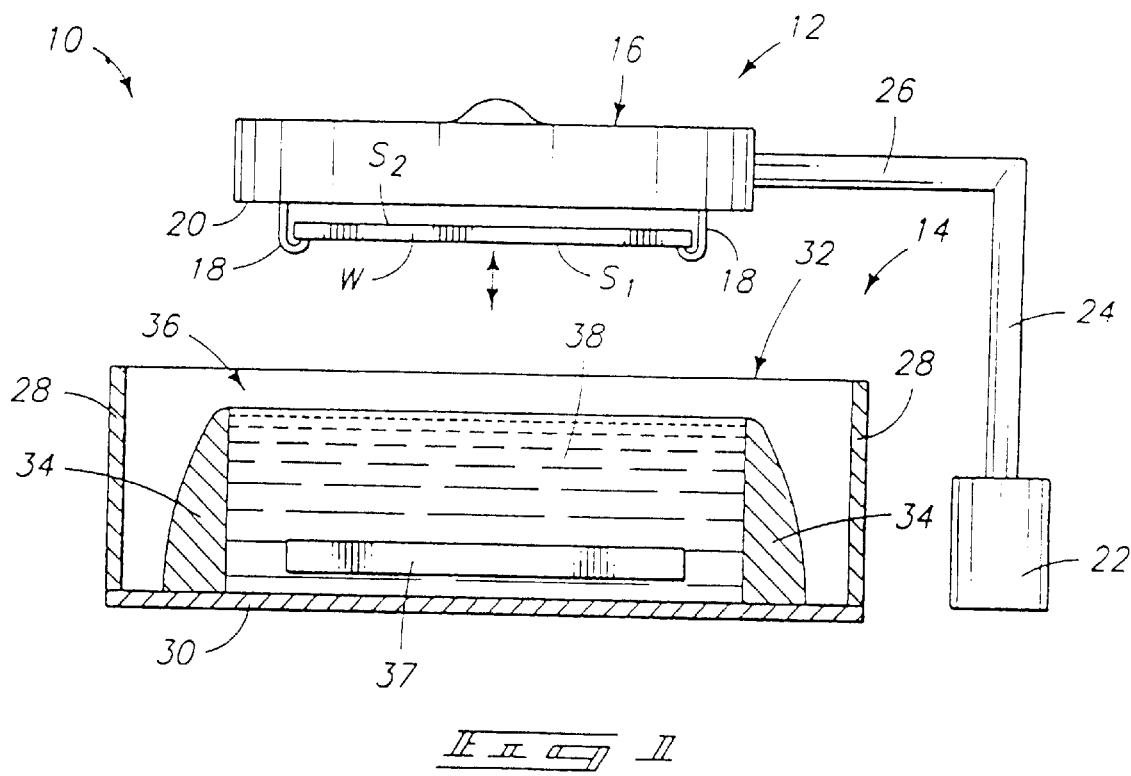
_Fig. 1_
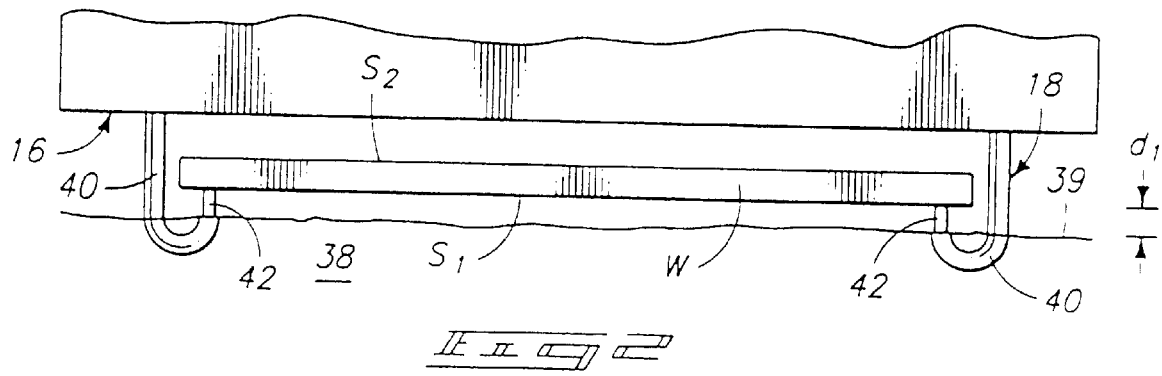
_Fig. 2_

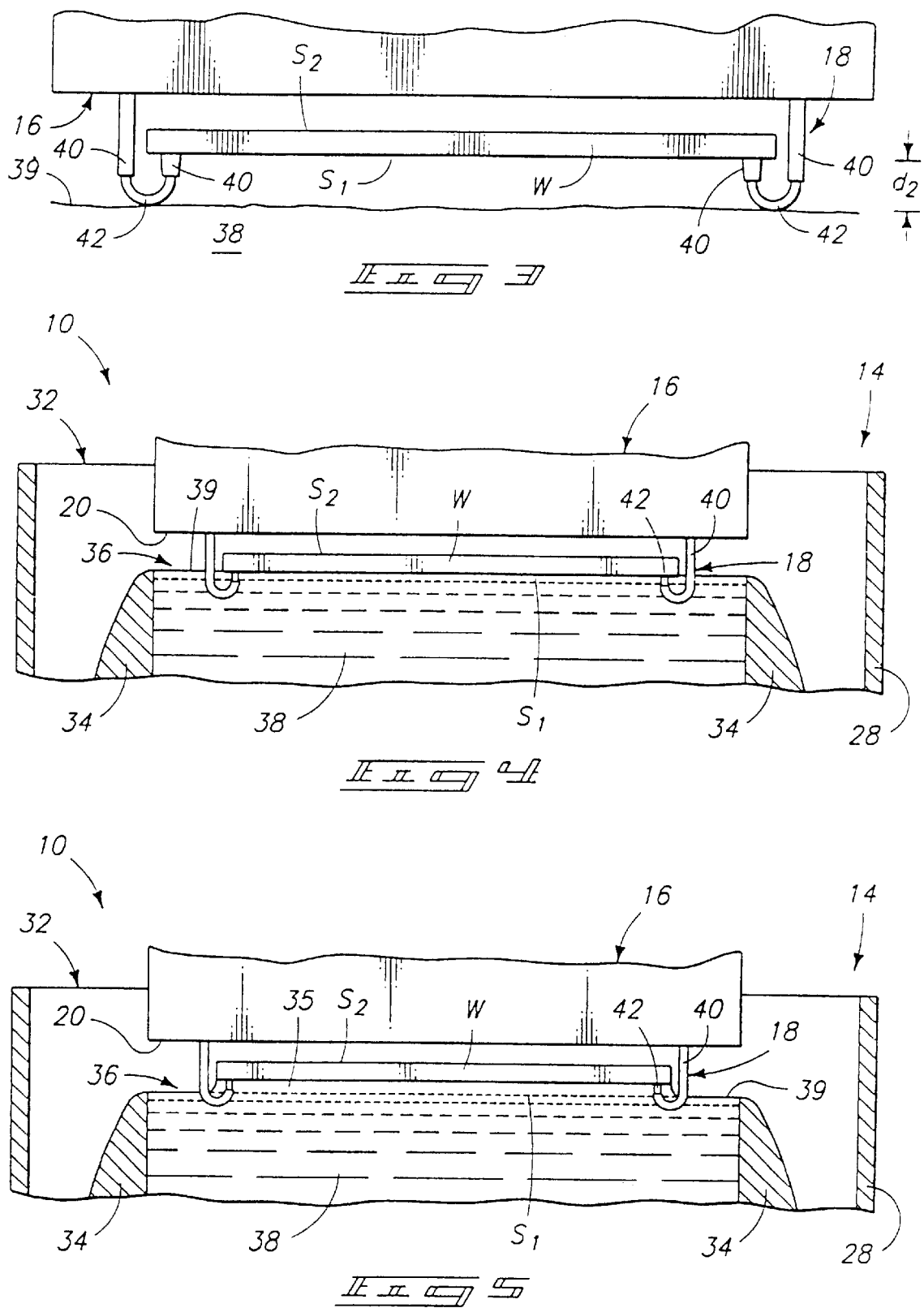

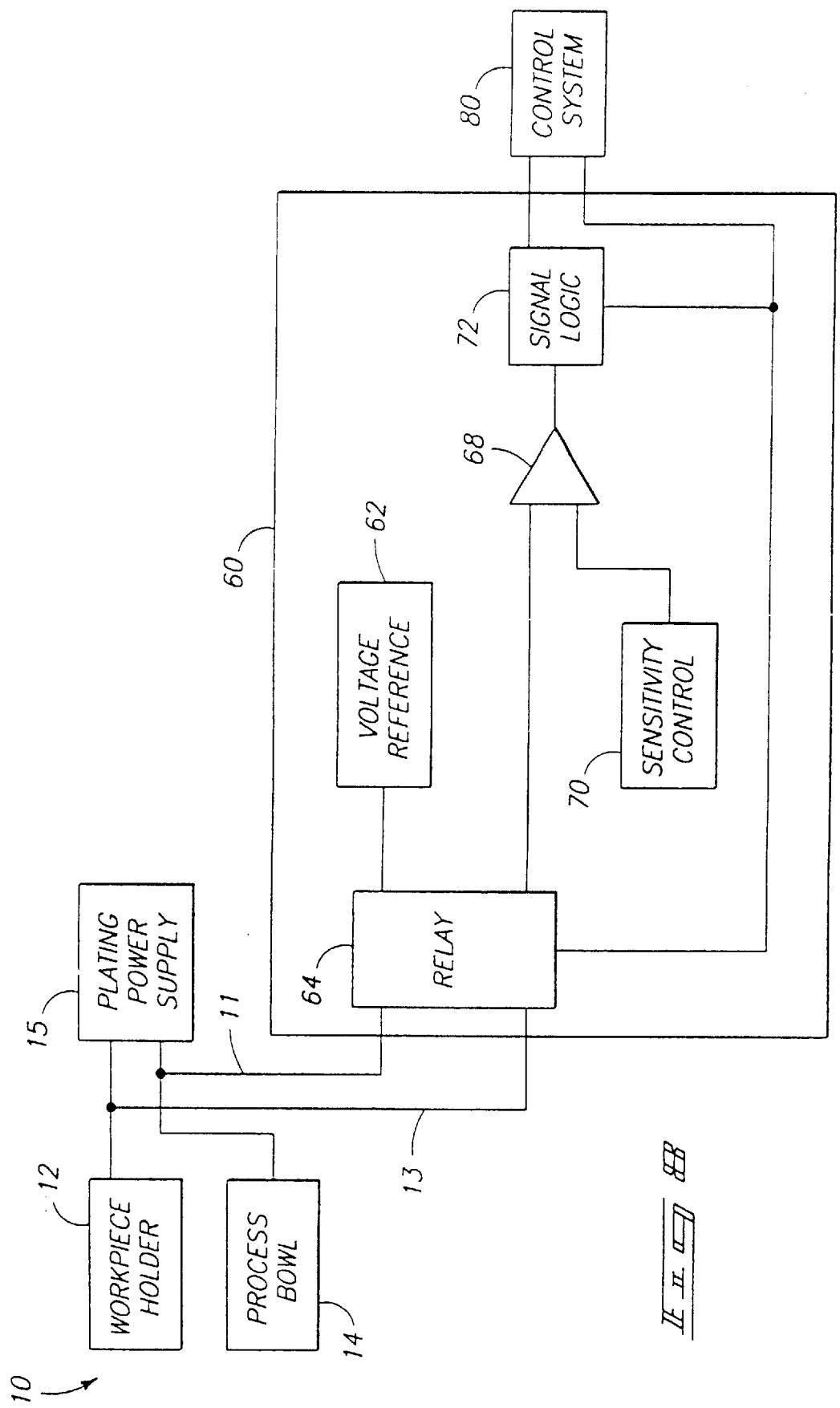

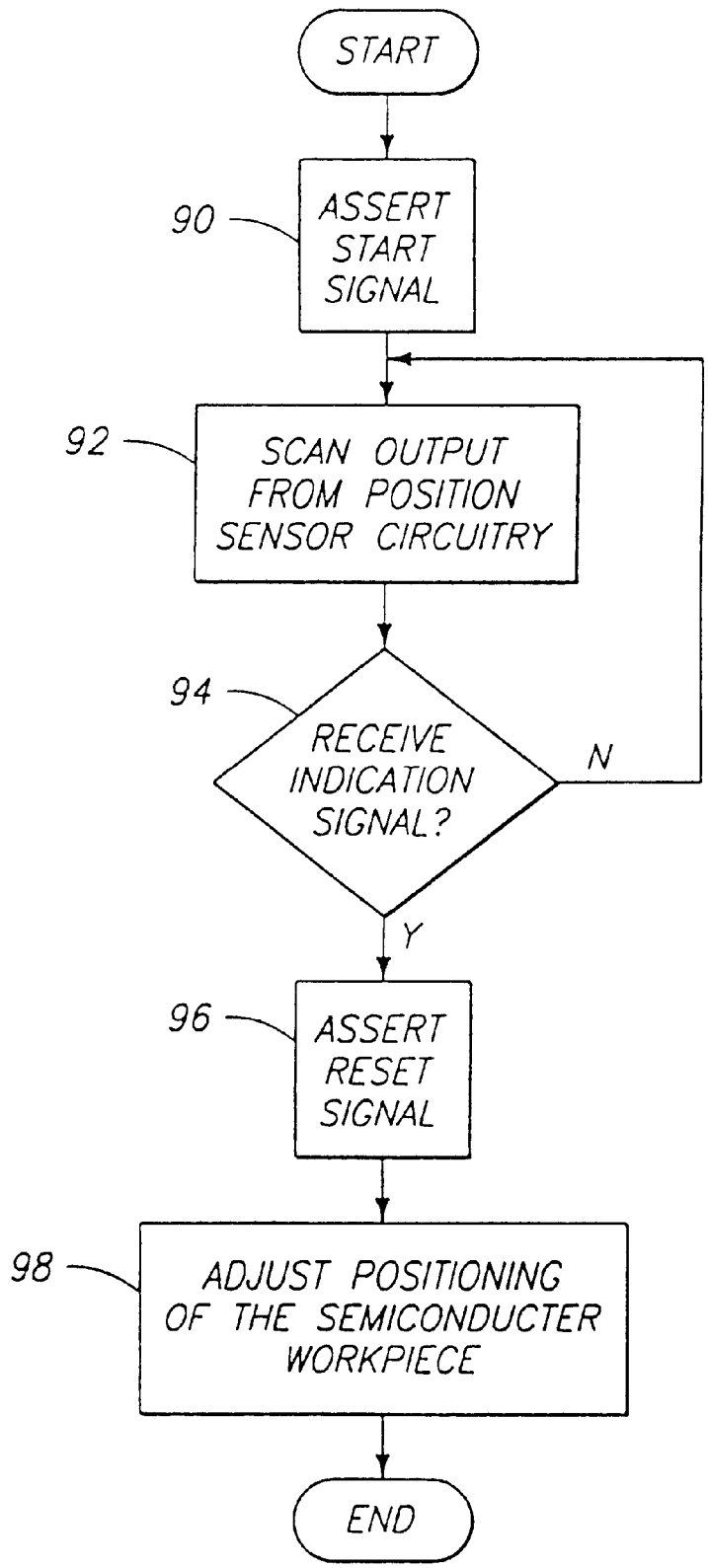

SEMICONDUCTOR PROCESSING WORKPIECE POSITION SENSING

This is a divisional application of U.S. Pat. application Ser. No. 08/940,523, filed Sep. 30, 1997, now U.S. Pat. No. 6,015,462 entitled SEMICONDUCTOR PROCESSING WORKPIECE POSITION SENSING.

TECHNICAL FIELD

The present invention relates to semiconductor workpiece position sensors and methods of monitoring the position of a semiconductor workpiece.

BACKGROUND OF THE INVENTION

The fabrication of semiconductor devices includes a plurality of processing steps. Individual devices are formed from die from a semiconductor workpiece such as a wafer. Typically there are four general categories of operations performed on a semiconductor wafer during the fabrication process. Such operations include layering, patterning, doping and heat treatments.

Layering provides thin layers to the surface of the semiconductor wafer. Patterning provides removal of selected portions of added surface layers. Doping of the semiconductor wafer is the process of applying specific amounts of dopants in the wafer surface through openings in the surface layers. Heat treatments of the semiconductor wafer involve operations in which the wafer is heated and/or cooled to achieve specific process results.

Numerous processing devices have been developed to implement the described processing steps of the semiconductor workpiece fabrication process. Depending upon the particular function of the workpiece and the processing device, various configurations are provided. Some conventional semiconductor workpiece processors utilize a semiconductor workpiece holder and a process bowl or container for implementing process steps such as plating, etching, etc.

The typical purpose of providing the workpiece holder and a process bowl is to enable the contacting of appropriate portions of the semiconductor wafer with a processing fluid held within the process bowl. General concerns during the fabrication process include directing the process fluid to the appropriate portions of the semiconductor wafer. Conventional semiconductor workpiece processors have utilized various techniques to shield the various portions of the semiconductor wafer which are not to be contacted by the process fluid. Examples of such conventional systems include applying tape to the back side of a semiconductor wafer to prevent process fluid from contacting the covered portions. Other configurations disclose holding the semiconductor workpiece with a suction cup arrangement to prevent fluid from coming in contact with the back side of the semiconductor wafer.

Although such conventional operations adequately fulfill the purpose of preventing process fluid from coming in contact with the back surface of the semiconductor wafer, other associated problems with the conventional systems still exist. For example, additional process steps are required including applying tape or covering the back surface of the semiconductor workpiece. Further, the semiconductor workpieces are fragile and care must be taken not to damage the wafer during covering of a surface of the wafer.

Therefore, a need exists to implement the semiconductor workpiece processing steps and control the application of process fluid to preselected portions of the semiconductor workpiece without the associated problems typically present in conventional semiconductor workpiece processors.

BRIEF DESCRIPTION OF THE DRAWINGS

Preferred embodiments of the invention are described below with reference to the following accompanying drawings.

FIG. 1 is a schematic representation of a process module of a semiconductor workpiece processor.

FIG. 2 is a side view of a first embodiment of a process head of the process module holding a semiconductor workpiece.

FIG. 3 is a side view, similar to FIG. 2, of a second embodiment of a process head of the process module.

FIG. 4 is a side view of the process head of FIG. 2 positioning a semiconductor workpiece in contact with a process fluid within a process container of the process module.

FIG. 8 is a functional block diagram of an embodiment of position sensor circuitry of the semiconductor workpiece processor.

FIG. 9 is a schematic diagram of the position sensor circuitry shown in FIG. 8.

FIG. 10 is a flow chart illustrating a method of monitoring and a controlling the position of a semiconductor workpiece.

DETAILED DESCRIPTION OF THE PREFERRED EMBODIMENTS

Figure 6:
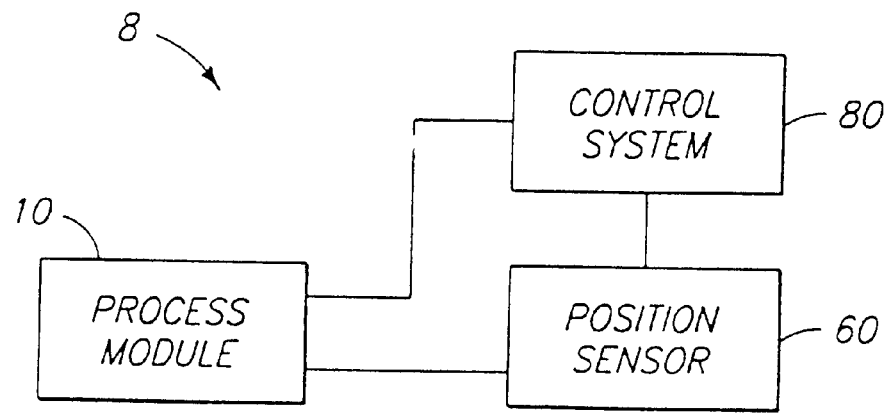
FIG. 6 is a functional block diagram illustrating various components according to one embodiment of the semiconductor workpiece processor.

This disclosure of the invention is submitted in furtherance of the constitutional purposes of the U.S. Patent Laws "to promote the progress of science and useful arts" (Article 1, Section 8).

Referring to FIG. 1, one embodiment of a process module 10 of a semiconductor workpiece processor is shown. The depicted process module 10 includes a semiconductor workpiece holder 12 and a process container or bowl 14. The semiconductor workpiece holder 12 of module 10 is configured to support a semiconductor workpiece W, such as a semiconductor wafer. The semiconductor wafer W has a first or lower surface $S_1$ and a second or upper surface $S_2$. Workpiece holder 12 includes a process head 16. Process head 16 includes fingers or holders 18 coupled with a lower surface 20 thereof. Fingers 18 of holder 12 are configured to support a semiconductor workpiece W adjacent a lower surface 20 of head 16. In the described embodiment, workpiece holder 12 is configured to support semiconductor workpiece W to provide processing of the lower surface $S_1$ thereof. Process head 16 may be configured to rotate or spin the semiconductor workpiece W held thereby. Such rotation of workpiece W may occur during processing of the workpiece.

Workpiece holder 12 is configured for vertical movement with respect to process bowl 14. More specifically, a vertical drive motor 22 is provided to implement vertical movement of process head 16. In the configuration shown in FIG. 1, vertical drive motor 22 is coupled with a vertically oriented shaft 24. Shaft 24 is coupled with a horizontal supporting member 26. Support member 26 is joined at a first end thereof with vertical shaft 24. A second end of support member 26 is distally spaced from vertical shaft 24. The second end of support member 26 is configured to engage and support process head 16 of workpiece holder 12.

Movement of vertical shaft 24 in either an upward or downward direction provides corresponding movement of head 16 upward or downward with respect to process bowl 14. In particular, vertical drive motor 22 is configured to lower head 16 to a sufficient position to bring semiconductor workpiece W in contact with process solution or fluid 38 within process bowl 14 Typically, the process fluid 38 is a liquid.

Such contacting of semiconductor workpiece W with process fluid 38 provides desired processing of preselected portions, such as the lower surface $S_1$, of the exposed surface of semiconductor workpiece W. The processing may include plating or etching portions of semiconductor workpiece W. Workpiece holder 12 is configured to rotate to facilitate engagement of semiconductor workpieces W with head 16 and removal of the workpieces therefrom. In the configuration shown in FIG. 1, head 16 is configured to rotate about an axis defined by support member 26. Semiconductor workpieces W may be engaged with head 16 of removed therefrom when head 16 is provided in a rotated vertical position (not shown).

Process bowl 14 of process module 10 includes sidewalls 28 and a lower wall 30 defining a process compartment 32. Process bowl 14 is shown in section in FIGS. 1, 4 and 5. Sidewalls 28 are annular in the described embodiment defining a substantially circular process compartment 32 within bowl 14 according to one embodiment.

In the described embodiment, a ring 34 is provided within process compartment 32. Ring 34 is spaced apart from sidewalls 28 defining an annular compartment therebetween Within ring 34, a fluid compartment 36 is defined. Ring 34 is operable to receive and contain the process fluid 38, such as a plating bath, within fluid compartment 36. Ring 34 is designed to maintain the level of process fluid 38 at a substantially constant level. In one embodiment, process fluid 38 flows upwardly for circulation and may spill over ring 34 maintaining the appropriate level thereof.

The illustrated process bowl 14 and workpiece holder 16 of process module 10 are exemplary configurations only. Other configurations of process module 10 are considered and within the scope of the present invention.

An anode 37 is provided within the fluid compartment 36 of process container 14 of the depicted process module 10. Anode 37 may be utilized in conjunction with a cathode (shown below as conductor 42 in FIG. 2). As described below, the cathode is provided within the fingers 18 of process head 16 in accordance with one embodiment. In the described embodiment, the semiconductor workpiece processor is configured to provide electroplating of the semiconductor workpiece W and the anode and cathode of process module 10 are coupled with a plating power supply 15 (shown in FIG. 8). Plating power supply 15 is configured to provide a voltage differential therebetween. Alternatively, the semiconductor workpiece processor is configured to provide other semiconductor workpiece processing steps.

As previously mentioned, some semiconductor workpiece processing methods require processing of only selected portions of a given semiconductor workpiece W. Often, it is desired to only process one surface of a given semiconductor workpiece W. In such situations it may be desired to shield the other surface of the semiconductor workpiece W to prevent process fluid from coming into contact therewith during processing of the workpiece.

The present invention as described in detail below accommodates such selective processing of the semiconductor workpiece W. In particular, semiconductor workpiece processor is adapted to provide processing of the lower surface $S_1$ of semiconductor workpiece W in a preferred embodiment of operation. During this mode of operation, the second surface $S_2$ and the edges of the semiconductor workpiece W do not come into contact with the process fluid 38.

Referring to FIG. 2, a process head 16 having fingers 18 in accordance with a first embodiment is shown. Although only two fingers 18 are shown in FIG. 2, it is to be understood that other numbers of fingers 18 may be provided in alternative embodiments of process head 16. A sufficient number of fingers 18 are provided to adequately and securely support a semiconductor workpiece W.

In the preferred embodiment of the invention, fingers 18 are configured to conduct an electric signal and provide a cathode. As described in detail below, conducting a signal through fingers 18 may be utilized to indicate the position of semiconductor workpiece W is relative to process fluid 38 as well as process workpiece W.

Alternatively, process head 16 may provide other cathode configurations for conducting an electric signal. Further, the cathode may be provided in process fluid 38 and the anode may be implemented within process head 16 in accordance with other embodiments of the present invention.

The fingers 18 shown in FIG. 2 comprise a conductive material to receive and conduct an electric signal. The embodiment of fingers 18 shown in FIG. 2 provides dielectric coatings 40 about selected portions of the fingers 18. The dielectric coatings 40 are removed from selected i portions of fingers 18 to expose conductors 42. Conductors 42 are provided in electrical communication with process head 16 and may operate as the cathode described above. In particular, the conductors 42 extend through the length of respective fingers 18 to appropriate signal receptors in process head 16. Conductors 42 of fingers 18 are exposed at selected portions of fingers 18 to receive electric signals emitted from anode 37.

As workpiece holder 12 is lowered toward process bowl 14, fingers 18 are dipped into process fluid 38 provided within fluid compartment 36. It is desired to provide semiconductor workpiece W at a preselected position relative to process fluid 38 to provide processing of appropriate portions of semiconductor workpiece W. An electric signal, also referred to as a reference signal, is provided within process fluid 38 in one embodiment via anode 37. Touching conductors 42 with process fluid 38 completes a position sensing circuit. In particular, the reference signal is received by fingers 18 of process head 16 in accordance with the present invention. Reception of the reference signal indicates position of semiconductor workpiece W with respect to process fluid 38. The reception of the reference signal may be utilized to thereafter control the positioning of semiconductor workpiece W with respect to process fluid 38.

Depending upon the positioning of the exposed portions of conductors 42 within fingers 18, the reception and passage of the reference signal may be selected to indicate various distances between semiconductor workpiece W and process fluid 38. As shown in FIG. 2, conductors 42 are brought into contact with process fluid 38 corresponding to a distance $d_1$ intermediate lower surface $S_1$ of workpiece W and a surface or meniscus 39 of process fluid 38. The reference signal emitted from anode 37 is received by fingers 18 when workpiece W is positioned at the distance $d_1$ from process fluid 38.

Referring to FIG. 3, a second embodiment of fingers 18 is shown. Fingers 18 individually include a conductor 42 extending throughout the length thereof. The illustrated fingers 18 also include dielectric coatings 40 provided about preselected portions of conductors 42. Exposing different portions of conductors 42 enables indication of the position of semiconductor workpiece W with respect to process fluid 38 at differing distances therebetween.

Referring to the embodiment of fingers 18 shown in FIG. 2, the signal is received and passed through conductors 42 and print head 16 once the process fluid 38 contacts the exposed portions of conductor 42 indicating a distance $d_1$ between upper surface 39 of process fluid 38 and lower surface $S_1$ of semiconductor workpiece W.

Referring to FIG. 3, the illustrated fingers 18 receive the reference signal at the exposed portions of conductors 42 corresponding to a greater distance $d_2$ intermediate lower surface $S_1$ of workpiece W and surface 39 of process fluid 38. The exposed portions of the conductors 42 may be varied to provide reception of the reference signal and position indication information corresponding thereto at variable distances in between semiconductor workpiece W and process fluid 38.

Referring to FIG. 4, the embodiment of workpiece holder 12 shown in FIG. 2 has been lowered a sufficient extent to submerge the lower portions of fingers 18 within process fluid 38. Workpiece holder 16 has been lowered a distance $d_1$ from the position shown in FIG. 2. The lower surface $S_1$ of workpiece W is wetted with process solution 38 in the position shown in FIG. 4. Semiconductor workpiece W may be held at the position shown in FIG. 4 to provide processing of the lower surface $S_1$ thereof. In addition, no process fluid 38 is provided upon the second surface $S_2$ of the semiconductor workpiece W.

Figure 5:
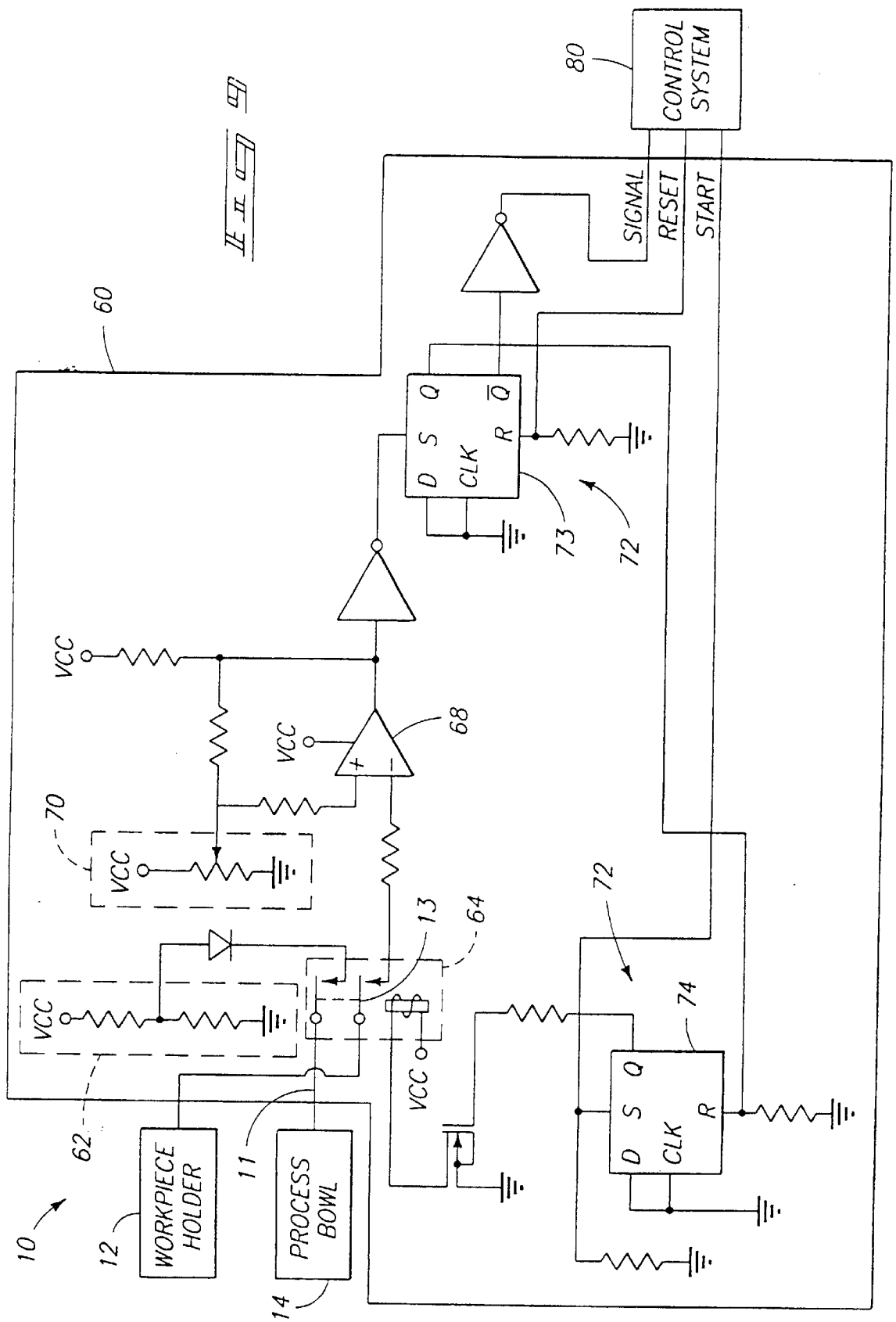
FIG. 5 is a side view illustrating the formation of a column of process fluid intermediate the semiconductor workpiece and the process fluid bath.

Referring to FIG. 5, process head 16 may be raised following contacting of lower surface $S_1$ of semiconductor workpiece W with surface 39 of process fluid 38. The process head 16 and semiconductor workpiece W held thereby may be raised a predetermined distance to provide a column 35 of process fluid 39 between the lower surface $S_1$ of semiconductor workpiece W and the remaining process fluid 38 within fluid compartment 36. The column 35 of process fluid 39 may be a few millimeters in height. For example, column 35 may have a height within a range of approximately zero millimeters to five millimeters, and typically within a range of one to three millimeters.

Such raising of semiconductor workpiece W minimizes the likelihood that process fluid 38 will splash onto the upper surface $S_2$ thereof. The positioning of semiconductor workpiece W with respect to process fluid 38 may vary and is dependent upon the specific type of plating coverage or other processing desired.

Once conductor 42 contacts process fluid 38, the reference signal is received within conductor 42 and passed through the length of finger 18 to process head 16. As discussed below, the reference signal is subsequently passed through process head 16 and applied to position sensor circuitry 60 in accordance with one embodiment of the present invention. Position sensor 60 is configured to generate a position indication signal responsive to receiving the reference signal. The position indication signal may be applied to a control system 80 of the semiconductor workpiece processor. Responsive to receiving the position indication signal, control system 80 is operable to control the vertical drive motor 22 providing movement of process head 16 and semiconductor workpiece W relative to process fluid 38.

Referring to FIG. 6, one configuration of a semiconductor workpiece processor 8 is shown in a block diagram. The illustrated workpiece processor 8 includes a control system 80, process module 10 and position sensor 60. Control system 80 is electrically coupled with position sensor circuitry 60 and process module 10.

Figure 7:
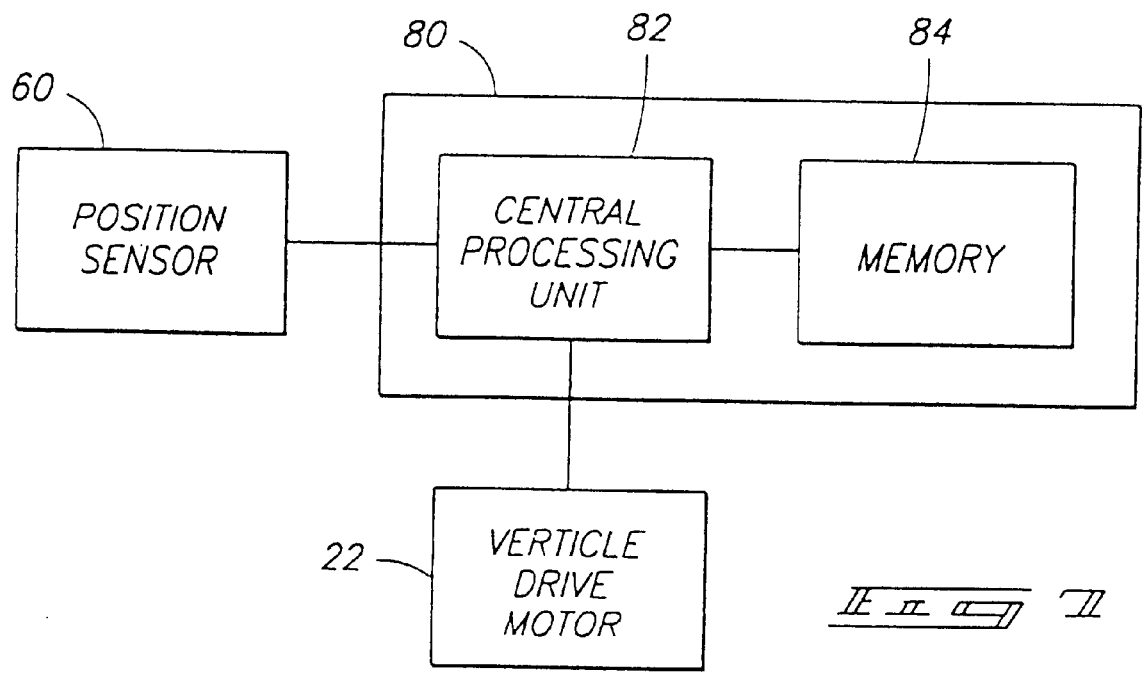
FIG. 7 is a functional block diagram of an embodiment of a control system of the semiconductor workpiece processor.

Referring to FIG. 7, one embodiment of the control system 80 is shown. Control system 80 comprises a central processing unit 82 (CPU) and a memory device 84. Central processing unit 82 is operable to interface with memory device 84. Memory 84 may implemented as either RAM or ROM or both. Memory 84 is configured to store operational code described below with respect to the flow chart of FIG. 10. The central processing unit 82 of control system 80 is configured via the operational code to receive position information from position sensor 60 and control vertical drive motor 22 and the positioning of semiconductor workpiece W responsive thereto.

Referring to FIG. 8, one embodiment of position sensor 60 is shown. The illustrated position sensor 60 includes a voltage reference 62, relay 64, comparator 68, sensitivity control circuitry 70, and signal logic circuitry 72. The relay 64 is coupled with the anode 37 of process bowl 14 and the cathode of workpiece holder 12 of process module 10, as well as plating power supply 15. The signal logic 72 and relay 64 of position sensor 60 are coupled with the control system 80 of the semiconductor workpiece processor 8.

In general, position sensor 60 generates and outputs the reference signal. Voltage reference 62 operates as a signal generator to create the reference signal. The reference signal generated by voltage reference 62 is a low voltage, low current electric signal in one embodiment of the invention. In the described embodiment, the reference signal is one volt and approximately two milliamps.

The reference signal is selectively applied to process module 10 responsive to control signals from control system 80. Upon start-up and prior to processing of a semiconductor workpiece W, control system 80 applies an appropriate control signal to relay 64. Relay 64 is energized responsive to receiving the control signal and applies the reference signal to process bowl 14 via electrical connection line 11.

Responsive to the first surface $S_1$ of semiconductor workpiece W touching the meniscus 39 of process fluid 38, the reference signal applied via line 11 passes through process fluid 38 and fingers 18 of workpiece holder 12. In essence, the touching of semiconductor workpiece W with process fluid 38 closes an otherwise open circuit between workpiece holder 12 and process bowl 14. The signal is returned via a second electrical connection line 13 to relay 64 within position sensor 60.

Relay 64 remains energized and passes the returned reference signal to comparator 68. A sensitivity control signal from sensitivity control 70 is also applied to comparator 68. Adjusting sensitivity control 70 adjusts the trip point for comparator 68. Sensitivity control 70 comprises a potentiometer in accordance with one embodiment of the invention. Responsive to receiving the reference signal from relay 64, comparator 68 generates and applies an indication signal to signal logic 72.

Signal logic 72 is configured to store the indication signal and de-energize the relay 64 responsive to receiving the indication signal. Such de-energization of relay 64 insulates position sensor circuitry 60 from electrical connection lines 11, 13. In particular, plating power supply 15 is operable to apply a high voltage across electrical connection lines 11, 13 and the anode and cathode of process module 10 responsive to control from central processing unit 82. De-energizing relay 64 protects position sensor circuitry 60 from the high voltages. Once relay 64 has been de-energized, central processing unit 82 may turn on plating power supply 15 to implement plating of the semiconductor workpiece W.

Referring to FIG. 9, a detailed schematic of position sensor circuitry 60 described above is shown. The illustrated position sensor 60 includes voltage reference 62, comparator 68, sensitivity control 70, and latches 73, 74. In the illustrated embodiment, signal logic 72 comprises latches 73, 74. Relay 64 is coupled with workpiece holder 12 via electrical connection line 13 and process bowl 14 via electrical connection line 11. Control system 80 is operable to receive the indication signal from latch 73, apply a reset signal to latch 73 and apply a start signal to latch 74.

Responsive to the assertion of a start signal via control system 80, latch 74 is set. Setting latch 74 energizes relay 64 coupling voltage reference 62 with process bowl 14 via electrical connection 11. In addition, energizing relay 64 electrically couples workpiece holder 12 with comparator 68 via electrical connection 13.

The reference signal is applied to comparator 68 responsive to the reference signal passing through process fluid 38 and fingers 18 of process head 16. Comparator 68 applies an indication signal to latch 73 responsive to receiving the reference signal. The application of the indication signal to latch 73 sets latch 73. Responsive to being set, latch 73 outputs a signal to latch 74 which resets latch 74.

Responsive to receiving the indication signal, latch 73 stores the indication signal and applies the indication signal to control system 80. Latch 73 latches the indication signal enabling the central processing unit 82 of control system 80 to scan in the indication signal according to timing of control system 80.

Once the central processing unit 82 of control system 80 reads in the indication signal, the central processing unit 82 is configured to subsequently output a reset signal to clear latch 73. Thereafter, the central processing unit of the control system 80 reasserts the start signal to set latch 74 once a subsequent semiconductor workpiece W is properly positioned within process head 16 and prior to the lowering of the head 16 and semiconductor workpiece W toward process fluid 38 within process container 14.

As stated above, control system 80 is configured to monitor and detect the presence of an indication signal from signal logic 72. The presence of an indication signal provides position information of the semiconductor workpiece W with respect to process fluid 38. Responsive to receiving the indication signal, control system 80 is configured to operate vertical drive motor 22 and adjust the vertical position of semiconductor workpiece W with respect to the process fluid 38.

More specifically, control system 80 can instruct vertical drive motor 22 to move process head 16 and the semiconductor workpiece W held thereby to contact the process fluid 38. The particular distance moved is typically preselected and corresponds to the distance intermediate semiconductor workpiece W and the process fluid 38. The semiconductor workpiece W may be lowered following the reception of the indication signal to account for the distance between the lower surface $S_1$ of the semiconductor workpiece W and the process fluid 38 corresponding to the exposed portion of the electrode 42 within finger 18. The particular portions of conductors 42 which are exposed may be varied to adjust the calibration (i.e., distance between the workpiece W and process fluid 38 at the moment the reference signal passes through conductor 42). Alternatively, adjustments of calibration may be implemented by software.

Lowering and contacting the semiconductor workpiece W with process fluid 38 wets the lower surface $S_1$ thereof with the fluid 38. In one embodiment, the lowering of workpiece W results in the spreading of the meniscus 39 of process fluid 38 over the entire lower surface $S_1$ of the semiconductor workpiece W.

Responsive to receiving the indication signal from position sensor 60, control system 80 knows the exact position of semiconductor workpiece W with respect to the surface 39 of process fluid 38. Subsequent movement of process head 16 and semiconductor workpiece W following the reception of the indication signal may be variable depending upon the particular application.

In addition, following the touching of the lower surface $S_1$ of the semiconductor workpiece W to the meniscus 39 of process fluid 38, control system 80 may also be configured to retract or raise the semiconductor workpiece W a predetermined distance to provide the column 35 of process fluid 39 between semiconductor workpiece W and the remaining process fluid 38 within fluid compartment 36. The lower surface $S_1$ of semiconductor workpiece W preferably remains wetted during the retraction of process head 16 and workpiece W. An adhesive force or tension overcomes the gravitational force and maintains the process fluid 38 in contact with the lower surface $S_1$ during retraction of the workpiece W thereby forming column 35. The formed column 35 of process fluid 38 may be a few millimeters in height. The positioning of semiconductor workpiece W with respect to process fluid 38 may vary and is dependent upon the specific type of plating coverage desired.

Referring to FIG. 10, operation of the control system 80 in accordance with one embodiment of the invention is described. A process of monitoring the presence of an indication signal and adjusting workpiece positioning responsive thereto is described with reference to the flow chart. Central processing unit 82 is configured via software code from memory 84 according to the illustrated flow chart. The control operations described in the depicted flow chart are implemented in hardware according to alternative embodiments of the invention.

According to the software code, central processing unit 82 proceeds to step 90 and asserts a start signal. The start signal is asserted prior to the lowering of the semiconductor workpiece W toward the meniscus 39 of process fluid 38. Assertion of the start signal sets second latch 74 thereby electrically coupling position sensor 60 and process module 10 via relay 64.

Following the assertion of the start signal, the central processing unit 82 proceeds to step 92. At step 92, central processing unit 82 scans or reads the output of first latch 73 of position sensor 60 according to timing of the control system 80. Following the scanning, central processing unit 82 analyzes the received signal for reception of an indication signal indicating the lower surface $S_1$ of semiconductor workpiece W being in contact with surface 39 of process fluid 38. If the indication signal is not present, central processing unit 82 continues to scan the output of first latch 73 of signal logic 72.

Central processing unit 82 proceeds to step 96 if the indication signal is received. Central processing unit 82 asserts the reset signal at step 96. First latch 73 is cleared responsive to the assertion of the reset signal.

Thereafter, central processing unit 82 proceeds to step 98. The positioning of the semiconductor workpiece W relative to the process fluid 38 is adjusted as needed at step 98. For example, referring to FIG. 2, semiconductor workpiece W may be lowered a distance $d_1$ at step 98 depending upon the calibration of the process module 10 corresponding to the distance between the lower surface $S_1$ and surface 39 of process fluid 38. As described above, this distance corresponds to the particular fingers 18 utilized with process head 16.

Alternatively, semiconductor workpiece W may be lowered a distance $d_2$ at step 98 if the process head 16 shown in FIG. 3 and the fingers 18 associated therewith are utilized. The process described with reference to FIG. 10 may be repeated when a subsequent semiconductor workpiece W is to be processed.

Adjusting the positioning of semiconductor workpiece W relative to process fluid 38 preferably coats or wets the lower surface $S_1$ of the semiconductor workpiece with the process fluid 38. Processing of the semiconductor workpiece W in accordance with the described method eliminates the need for covering the edges or upper surface $S_2$ of the semiconductor workpiece inasmuch as process fluid 38 is not applied to the sides or upper surface of the workpiece.

In addition, the semiconductor workpiece W may be subsequently raised following the coating of the lower surface $S_1$ thereof. An attractive force draws the process fluid upward forming a column 35 of process fluid between the semiconductor workpiece W and the process fluid bath 38. Such raising of semiconductor workpiece W reduces the chance of exposure of the sides or edges and upper surface $S_2$ of workpiece W to the process fluid 38. The edges and upper surface $S_2$ of workpiece W preferably remain free of plating solution during the processing and unwanted plating or processing of various portions of workpiece W is minimized.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of monitoring position of a semiconductor workpiece comprising:

providing a process module including a process container having a process fluid therein and a workpiece holder configured to support the semiconductor workpiece;

moving the semiconductor workpiece toward the process fluid within the process container;

applying a reference signal to the process module; and indicating position of the semiconductor workpiece with respect to the process fluid responsive to the reference signal.

2. The method according to claim 1 further comprising emitting the reference signal within the process fluid.

3. The method according to claim 1 further comprising receiving the reference signal within the workpiece holder prior to the indicating.

4. The method according to claim 1 wherein the workpiece holder includes conductive fingers operable to receive the reference signal.

5. The method according to claim 1 wherein the indicating is responsive to the semiconductor workpiece being a predetermined distance from the process fluid.

6. The method according to claim 1 wherein the indicating comprises generating an indication signal.

7. The method according to claim 6 further comprising storing the indication signal.

8. The method according to claim 1 further comprising using a position sensor for providing the indicating.

9. The method according to claim 8 further comprising selectively insulating the position sensor from the process module.

10. A method of monitoring position of a semiconductor workpiece comprising:

providing a semiconductor workpiece;

providing a process fluid;

moving a semiconductor workpiece toward the process fluid;

generating a reference signal using a signal generator;

passing the reference signal responsive to the semiconductor workpiece being a predetermined distance from the process fluid; and indicating position of the semiconductor workpiece responsive to the reference signal.

11. The method according to claim 10 further comprising emitting a reference signal within the process fluid.

12. The method according to claim 10 wherein the indicating is responsive to the passing.

13. The method according to claim 10 wherein the passing comprises passing the reference signal through the process fluid prior to the indicating.

14. The method according to claim 10 further comprising using a position sensor to provide the indicating.

15. The method according to claim 14 further comprising selectively insulating the position sensor responsive to the reference signal.

16. The method according to claim 10 further comprising receiving the reference signal using a workpiece holder.

17. The method according to claim 16 wherein the workpiece holder includes at least one finger configured to receive the reference signal.

18. The method according to claim 17 wherein the finger is operable to support the semiconductor workpiece.

19. The method according to claim 10 wherein the indicating includes generating an indication signal.

20. The method according to claim 19 further comprising storing the indication signal.

\* \* \* \* \*